(12) United States Patent
Araki et al.

(10) Patent No.: US 11,538,721 B2
(45) Date of Patent: Dec. 27, 2022

(54) EVALUATION METHOD OF METAL CONTAMINATION

(71) Applicant: GLOBALWAFERS JAPAN CO., LTD., Niigata (JP)

(72) Inventors: Nobue Araki, Niigata (JP); Takeshi Onozuka, Niigata (JP); Tomoyuki Ishihara, Niigata (JP)

(73) Assignee: GLOBALWAFERS JAPAN CO., LTD., Niigata (JP)

( * ) Notice: Subject to any disclaimer, the term of this patent is extended or adjusted under 35 U.S.C. 154(b) by 267 days.

(21) Appl. No.: 16/956,282

(22) PCT Filed: Aug. 2, 2018

(86) PCT No.: PCT/JP2018/029009
§ 371 (c)(1),
(2) Date: Jun. 19, 2020

(87) PCT Pub. No.: WO2019/123706
PCT Pub. Date: Jun. 27, 2019

(65) Prior Publication Data
US 2021/0082774 A1 Mar. 18, 2021

(30) Foreign Application Priority Data
Dec. 22, 2017 (JP) .............................. JP2017-246190

(51) Int. Cl.
*H01L 21/00* (2006.01)
*H01L 21/66* (2006.01)
(Continued)

(52) U.S. Cl.
CPC .............. *H01L 22/12* (2013.01); *C30B 15/14* (2013.01); *C30B 15/203* (2013.01);
(Continued)

(58) Field of Classification Search
CPC ... H01L 22/12; H01L 21/02104; H01L 22/22; C30B 15/14; C30B 15/203; G01N 21/6408; G01N 21/6489; H01J 37/32073
See application file for complete search history.

(56) References Cited

U.S. PATENT DOCUMENTS 10,141,180 B2 * 11/2018 Araki ..................... C30B 33/02
2006/0130738 A1 6/2006 Kurita et al.
(Continued)

FOREIGN PATENT DOCUMENTS

JP 2004189584 A 7/2004
JP 2009302337 A 12/2009
(Continued)

OTHER PUBLICATIONS

Extended European Search Report dated Aug. 10, 2021, by the European Patent Office in corresponding European Application No. 18891783.5. (10 pages).
(Continued)

*Primary Examiner* — Richard A Booth
(74) *Attorney, Agent, or Firm* — Buchanan, Ingersoll & Rooney PC (57) ABSTRACT

A method of evaluating metal contamination by measuring the amount of metal contaminants to a silicon wafer in a rapid thermal processing apparatus includes steps of obtaining a Si single crystal grown by the Czochralski method at a pulling rate of 1.0 mm/min or lower, the crystal having oxygen concentration of $1.3 \times 10^{18}$ atoms/cm$^3$ or less, slicing silicon wafers from the Si single crystal except regions of 40 mm toward the central portion from the head of the single crystal and 40 mm toward the central portion from the tail, heat-treating the silicon wafer with a rapid thermal processing apparatus and transferring contaminants from members in a furnace of the rapid thermal processing apparatus to the
(Continued)

silicon wafer, and measuring a lifetime of the silicon wafer to which contaminants are transferred.

5 Claims, 9 Drawing Sheets

(51) Int. Cl.
  *C30B 15/14* (2006.01)
  *C30B 15/20* (2006.01)
  *H01J 37/32* (2006.01)
  *H01L 21/02* (2006.01)
  *G01N 21/64* (2006.01)

(52) U.S. Cl.
  CPC ..... *G01N 21/6408* (2013.01); *G01N 21/6489* (2013.01); *H01J 37/32073* (2013.01); *H01L 21/02104* (2013.01); *H01L 22/22* (2013.01); *H01J 2237/24592* (2013.01)

(56) References Cited

U.S. PATENT DOCUMENTS

| 2010/0197146 | A1 | 8/2010 | Senda et al. |
| 2012/0001301 | A1 | 1/2012 | Ebara et al. |
| 2014/0191370 | A1 | 7/2014 | Sim |
| 2015/0020728 | A1 | 1/2015 | Hoshi et al. |

FOREIGN PATENT DOCUMENTS

| JP | 2010177494 A | 8/2010 |
| JP | 2013084840 A | 5/2013 |
| JP | 2013105914 A | 5/2013 |
| JP | 2014058414 A | 4/2014 |
| JP | 2017103275 A | 6/2017 |
| KR | 20040054017 A | 6/2004 |
| TW | 201239144 A | 10/2012 |
| TW | 201445013 A | 12/2014 |
| TW | 201639036 A | 11/2016 |
| TW | 201720972 A | 6/2017 |
| WO | 2004008118 A1 | 1/2004 |
| WO | 2010119614 A1 | 10/2010 |

OTHER PUBLICATIONS

International Search Report (PCT/ISA/210) dated Oct. 30, 2018, by the Japan Patent Office as the International Searching Authority for International Application No. PCT/JP2018/029009.

Written Opinion (PCT/ISA/237) dated Oct. 30, 2018, by the Japan Patent Office as the International Searching Authority for International Application No. PCT/JP2018/029009.

Taiwanese Office Action dated Dec. 25, 2019, issued by the Taiwanese Patent Office in the corresponding Taiwanese Patent Application No. 107128807. (3 pages).

* cited by examiner

EVALUATION METHOD OF METAL CONTAMINATION

TECHNICAL FIELD

The present invention relates to evaluation methods of metal contamination, in particular to an evaluation method of metal contamination which allows accurate evaluation of metal contamination in a furnace of a rapid thermal processing apparatus (RTP apparatus) with which Si wafers are thermally processed rapidly.

BACKGROUND ART

Reduction of metal contamination is a very important issue because contamination of wafers with metal impurities during production processes of silicon wafers or devices causes adverse effect to performance of products.

With regard to this issue, Patent Literature 1 (JP A 2013-84840) or Patent Literature 2 (JP A 2009-302337) discloses that a high-resistivity silicon wafer is processed in a thermal treatment furnace to transfer metal contaminants to the wafer and then metal impurities are detected using results of Fe—B concentration detection by the surface photovoltage (SPV) method or lifetime measurements by the microwave photoconductivity decay (μ-PCD) method.

CITATION LIST

Patent Literature

PL 1: JP A 2013-84840
PL 2: JP A 2009-302337

SUMMARY OF INVENTION

Technical Problem

In order to confirm effects by metal impurities in the furnace, it is necessary to take time for thermal processing at a predetermined temperature such that metal impurities should thoroughly diffuse into a silicon wafer, as disclosed in Patent Literature 1 and 2.

However, when a rapid thermal processing apparatus (RTP) is used as a thermal processing furnace, it is difficult to exactly evaluate contamination due to metal impurities because the lifetime reduction arises not due to metal contaminants but to vacancies.

In the measurement of lifetime, reduction of lifetime due to surface recombination occurs. Formation of a passivation film as a protective coating is necessary to prevent the reduction. Specifically, thermal oxidation and hydrofluoric acid (HF) passivation are mainly known as passivation techniques. Thermal oxidation is a method of forming a silicon oxide film (thermal oxide film) on a silicon surface by heating; a surface passivation effect is obtainable by introducing an excellent Si—SiO$_2$ interface. HF passivation is a method of chemical passivation using hydrofluoric acid (HF) aqueous solution.

The thermal oxidation method, however, has a problem where the method cannot be used for the purpose of managing contamination of the RTP apparatus because contamination from the thermal processing furnace for forming a thermal oxide film could occur.

Meanwhile, though HF passivation does not give any effects of thermal history, this passivation is problematic from the view point of sensitivity for managing contamination because the surface recombination rate is in a range of 20 to 40 cm/s and it is difficult to obtain a long lifetime.

The present invention is carried out under circumstances as described above, the object thereof is to provide a method of metal contamination evaluation capable of measuring and evaluating an amount of metal contamination to a silicon wafer in a rapid thermal processing apparatus with high accuracy.

Solution to Problem

The method of evaluating metal contamination according to the present invention to solve the above problem is a method of evaluating the metal contamination amount for measuring the amount of metal contaminants to a silicon wafer in a rapid thermal processing apparatus; the method includes steps of: obtaining a silicon single crystal grown by the Czochralski method at a pulling rate of 1.0 mm/min or lower, the crystal having oxygen concentration of $1.3 \times 10^{18}$ atoms/cm$^3$ or less, slicing wafers from the silicon single crystal excluding regions of 40 mm toward the central portion from the head and 40 mm toward the central portion from the tail, heat-treating the silicon wafers in a rapid thermal processing apparatus and heat-transferring contaminants from members in the furnace of the rapid thermal processing apparatus to the silicon wafers, and measuring the lifetime of the contaminant-transferred wafers.

In the steps of heat-treating the silicon wafers in a rapid thermal processing apparatus and heat-transferring contaminants from members in the furnace of the rapid thermal processing apparatus to the silicon wafers, it is desirable to form an oxide film having a thickness of 2 nm or more on the silicon wafer by holding the silicon wafer at a temperature of not less than 1100° C. and not more than the melting point of silicon for 1 to 60 seconds in an oxidizing gas atmosphere and then cooling down at a rate of 5° C./sec to 150° C./sec.

In the step of measuring the lifetime of the contaminant-transferred wafers, it is desirable to measure the lifetime, after forming a passivation layer to the wafer using corona charging.

In the step of measuring the lifetime of the contaminant-transferred wafers, it is desirable to measure the lifetime using a μ-PCD apparatus.

In the step of obtaining a silicon single crystal grown by the Czochralski method at a pulling rate of 1.0 mm/min or slower, the crystal having oxygen concentration of $1.3 \times 10^{18}$ atoms/cm$^3$ or less, it is desirable to control the dopant concentration to be $5 \times 10^{14}$ atoms/cm$^3$ or less.

After the step of measuring the lifetime of the contaminant-transferred wafers, it is desirable that, assuming that y denotes the concentration of the metal impurity and x denotes the lifetime, the method includes a step of obtaining the concentration y of the metal impurity that is given by substituting the measured lifetime for x of the expression below:

$$y = (-3.74E+07) \cdot x + (2.42E11) \qquad \text{Expression 2:}$$

Advantageous Effects of Invention

This method makes it possible to accurately evaluate influences in lifetime reduction due to metal impurities by reducing lifetime reduction caused by vacancy due to oxygen or lattice defects in the wafers.

The present invention can provide a method of metal contamination evaluation capable of measuring and evaluating an amount of metal contaminants to a silicon wafer in a rapid thermal processing apparatus with high accuracy.

DESCRIPTION OF EMBODIMENTS

A method of evaluating metal contamination according to the present invention will be described below. The method of evaluating metal contamination according to the present invention is a method for evaluating metal contamination inside a rapid thermal processing apparatus (Hereinafter also referred to as RTP apparatus). Specific steps are as follows: Silicon wafers are sliced from a silicon single crystal grown under a predetermined growth condition; a rapid thermally-oxidized (RTO) film is formed on the wafer by thermal treatment at a predetermined temperature in an oxidizing atmosphere in an RTP apparatus; contaminants from members constituting the RTP apparatus are thermally transferred to the wafers; and a passivation processing to the wafers is performed using corona charging. Metal contamination in the RTP apparatus is detected by measuring the lifetime of thus obtained wafers.

Figure 1:
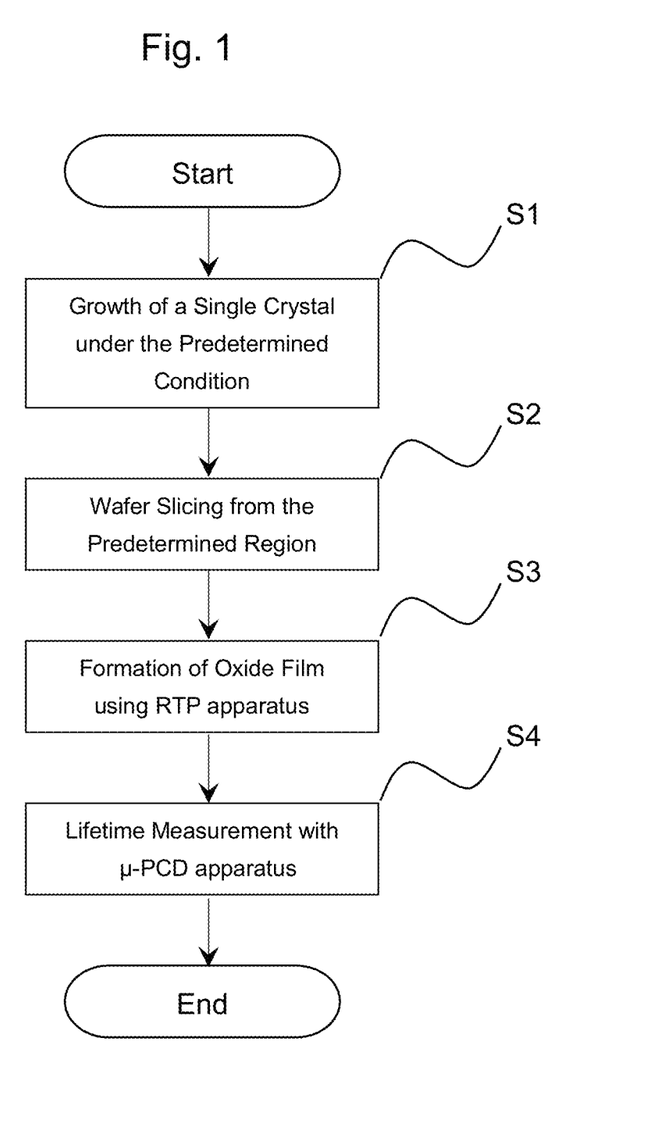
FIG. 1 is a flowchart showing processes of an evaluation method of metal contamination according to the present invention.

More specifically, processing is shown in FIG. 1.

First, a silicon single crystal is grown from which silicon wafers for metal contamination evaluation are sliced. (Step S1 in FIG. 1.) The single crystal is pulled up by the Czochralski method under the condition of an oxygen concentration of $1.3\times10^{18}$ atoms/cm$^3$ or less (old ASTM), dopant concentration of $5\times10^{14}$ atoms/cm$^3$ or less, and pulling rate of 1 mm/min or less.

When the dopant concentration is $5\times10^{14}$ atoms/cm$^3$ or less; that is, resistivity of the substrate is high, it is difficult to obtain the true value of lifetime in lifetime evaluation because influence of recombination of majority carriers on the surface of the wafer is likely to appear. With the present method according to the present invention, however, because of small influence of recombination, metal contamination can be accurately evaluated even when the dopant concentration is $5\times10^{14}$ atoms/cm$^3$ or less.

Figure 2:
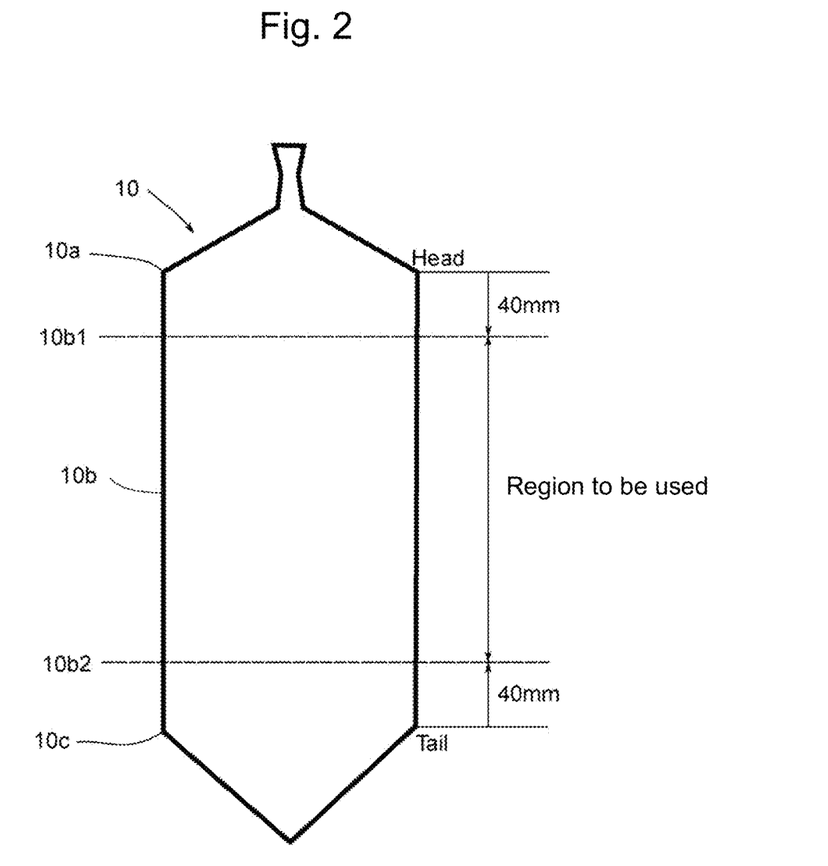
FIG. 2 is a side view showing a region of a single crystal portion, from which silicon wafers are sliced to be used in the evaluation method of metal contamination according to the present invention.

As shown in FIG. 2, with respect to a single crystal ingot 10, wafers are sliced from a straight portion 10b (an area to be used) excluding a portion from a head shoulder 10a, which is subject to thermal history at low temperature for a long time, of the straight portion 10b to a position 10b1 40 mm toward the center and a portion from a tail corn 10c to a position 10b2 40 mm toward the center. (Step S2 in FIG. 2)

The reason why the outside of this region is not adoptable is that concentration of vacancy becomes high and the lifetime reduces because in the outside of the region heat in the crystal is dissipated from upper and lower portions of the ingot; namely the crystal is easy to get cooled, and the outside region enters a temperature zone of vacancy formation while having a high vacancy density (V density).

In addition to the limitation of position of the crystal, limitation mentioned above such as oxygen concentration or pulling-up speed depends on influences of formation of vacancy that cause the lifetime reduction. Though the reality of the vacancy is not made clear, it is supposed to form a complex material of VO, VO$_2$, where V denotes vacancy and O denotes oxygen. And the temperature zone of formation of such vacancy is considered to be approximately in a range from 800° C. to 1000° C.

Density of V (vacancy) and I (interstitial Si), both of which are taken into the crystal at a solid-liquid interface of the Czochralski crystal at the thermal equilibrium temperature, decreases because of vacancy-interstitial Si pair annihilation in a cooling process of the crystal. To avoid reduction of lifetime due to vacancy, it is necessary to reduce the density of V. However, when the pulling-up speed exceeds 1 mm/min, the ingot goes into a temperature zone of vacancy formation while having high V vacancy density; resultantly density of vacancy becomes high to shorten the lifetime.

Because high oxygen concentration promotes formation of vacancy, it is desirable to set the oxygen concentration at $1.3\times10^{18}$ atoms/cm$^3$ or less (old ASTM).

Using the RTP apparatus, the silicon wafers are held at a temperature ranging 1100° C. to the melting point of silicon in an oxidizing atmosphere for 1 s to 60 s, and then cooled down at a rate of 5° C./s to 150° C./s to form an oxide (RTO) film with a thickness of 2 nm or more on the silicon wafers. (Step S3 in FIG. 1.)

Use of this RTP apparatus at a higher temperature promotes outward diffusion of metal impurities existing in members that constitute the apparatus, whereby metal impurities in the apparatus can be transferred on to the wafers sufficiently.

Generally speaking, oxygen atoms and vacancies in the wafer are made electrically active by RTP process and this may be a cause of lifetime reduction. Use of the wafers obtained under the condition of Step S1, however, can suppress reduction of lifetime caused by vacancy because oxygen atoms and vacancies hardly exist; therefore, only the reduction of lifetime due to metal contaminants can be measured.

The lifetime of the silicon wafers is measured by the μ-PCD method using corona charging passivation. (Step S4 in FIG. 1.) The corona charging process generates and controls electronic charges in the atmosphere; this corona charging process controls electronic charge state on the surface of the silicon wafers to be uniform.

A lifetime measurement is performed using a μ-PCD apparatus, LTA-2200EP manufactured by Kobelco Research Institute, Inc., for example, at 4 mm pitch at a carrier injection amount of $5 \times 10^{13}/cm^3$ with laser light having a wavelength of 904 nm. Pulse irradiation of the laser light to a silicon wafer generates excess carriers. The carriers are annihilated by recombination to return to the original equilibrium state. Changes of excess carrier density appear as an exponential change in resistivity in the light irradiated area, and the reflected microwave power changes accompanied thereby. The difference of the reflected microwave power before and right after the light pulse irradiation corresponds to the difference in resistivity, that is, the difference of carrier density; the lifetime of the carriers can be obtained from the temporal change of the reflected microwave power.

As shown in the embodiment according to the present invention above, a lifetime of silicon wafers is measured by μ-PCD method with the corona charge passivation process; the wafers are sliced from a silicon single crystal that is grown under the condition of oxygen concentration of $1.3 \times 10^{18}$ atoms/cm³ or less (old ASTM), and pulling rate of 1 mm/min or less, an RTO film is formed on the wafers by the RTP process at a high temperature ranging from 1100° C. to the melting point of silicon in an oxidizing atmosphere to thermally transfer contaminants from the members constituting the RTP apparatus to the wafers.

With this method, it is possible to evaluate influences in lifetime reduction due to metal impurities by reducing the lifetime reduction due to vacancy caused by oxygen or lattice defects in the wafers.

In addition, with this method according to the present invention, since accurate measurement of lifetime can be performed regardless of dopant concentration, the method is effective even when the dopant concentration is $5 \times 10^{14}$ atoms/cm³ or less where an influence of recombination of majority carriers on a wafer surface appears.

In the embodiment above, the corona charging is used for passivation, but passivation is not limited thereto in the method of metal contamination evaluation according to the present invention; the method is applicable to Si wafers using another passivation method.

A μ-PCD apparatus is used in lifetime measurement, but another measurement method of lifetime may be usable in the present invention.

EXAMPLES

An evaluation method of metal contamination according to the present invention will be described on the basis of examples. The following experiments were performed in the embodiments.

Experiment 1

In the experiment 1, a lifetime measurement described in the embodiments was performed on wafers grown under different conditions. In an Example 1, p-type wafers having a resistivity of 0.17 Ω·m were used. They were grown at a pulling rate of 0.6 mm/min under an oxygen concentration of $0.8 \times 10^{18}$ atoms/cm³ and a dopant (boron) concentration of $7.8 \times 10^{14}$ atoms/cm³.

In an Example 2 p-type wafers having a resistivity of 0.36 Ω·m were used. They were grown at a pulling rate of 1.5 mm/min under an oxygen concentration of $0.8 \times 10^{18}$ atoms/cm³ and a dopant (boron) concentration of $3.7 \times 10^{14}$ atoms/cm³.

In an Example 3, n-type Si wafers having a resistivity of 1.42 Ω·m were used. They were grown at a pulling rate of 1.5 mm/min under an oxygen concentration of $0.9 \times 10^{18}$ atoms/cm³ and a dopant (phosphorus) concentration of $3.0 \times 10^{13}$ atoms/cm³.

In the Examples 1 to 3, RTO films were formed under the same RTP process of heating at 1350° C. for 30 seconds, then cooling down at a rate of 120° C./s.

Lifetime measurements of respective wafers were performed using a μ-PCD apparatus, LTA-2200EP manufactured by Kobelco Research Institute, Inc., at a carrier injection amount of $5 \times 10^{13}/cm^3$ at a 4 mm pitch with laser light having a wavelength of 904 nm.

Figure 3:
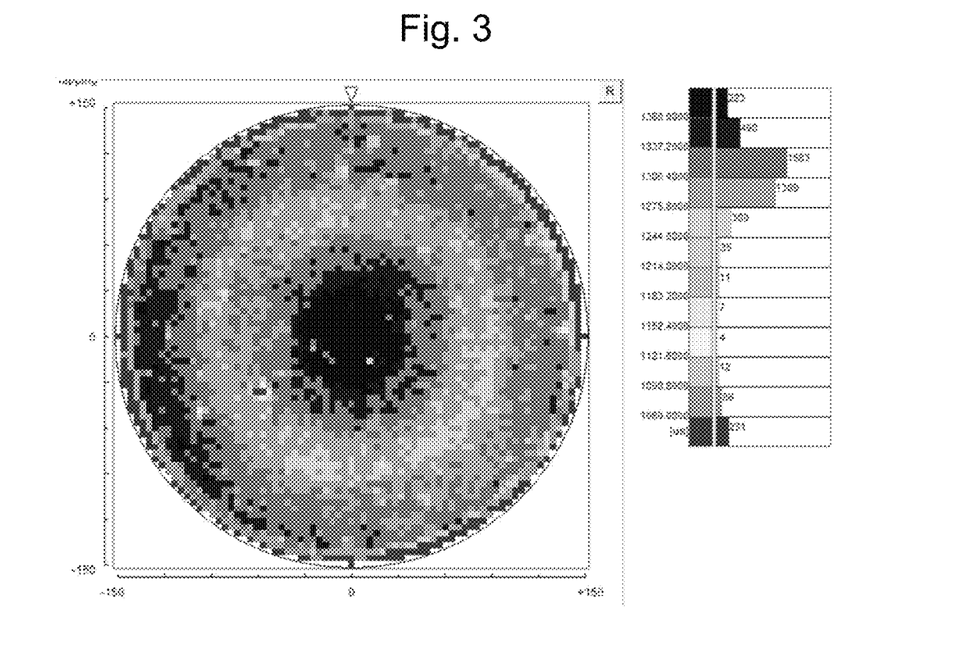
FIG. 3 is a distribution map illustrating the result of Example 1 of the evaluation method of metal contamination according to the present invention.
Figure 4:
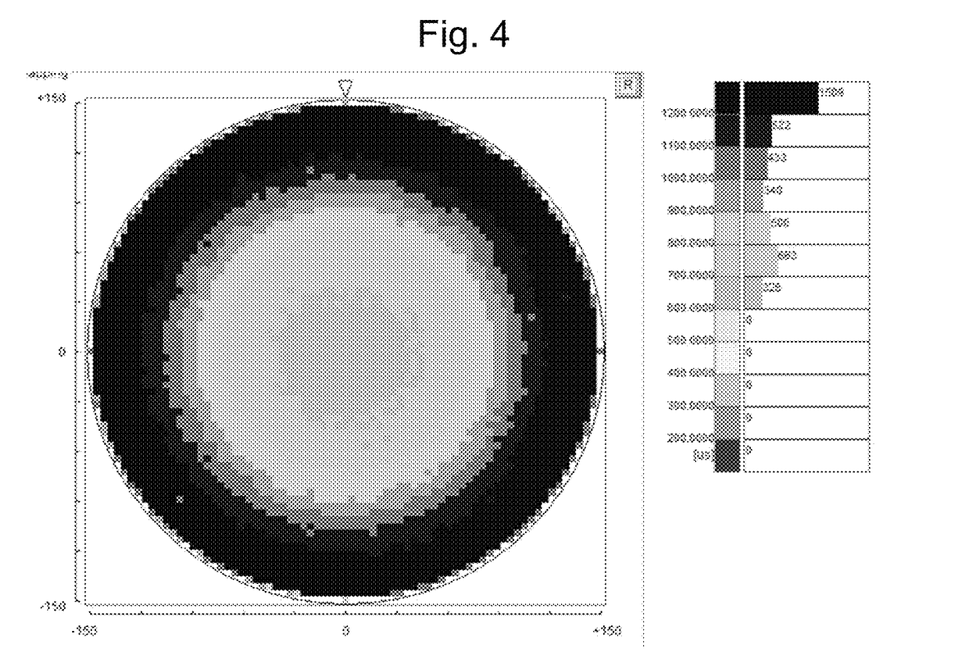
FIG. 4 is a distribution map illustrating the result of Example 2 of the evaluation method of metal contamination according to the present invention.
Figure 5:
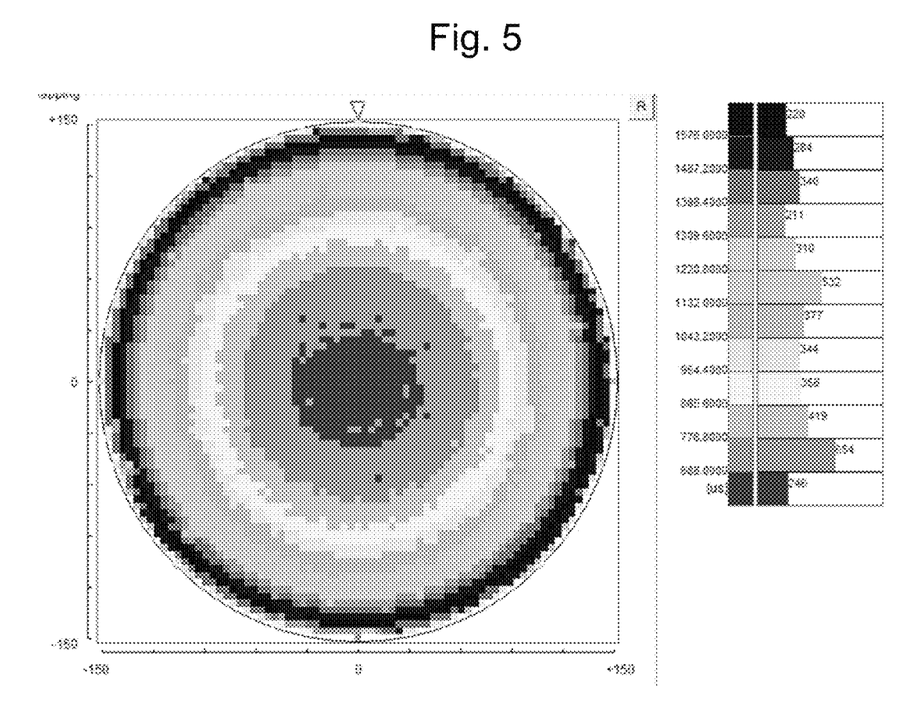
FIG. 5 is a distribution map illustrating the result of Example 3 of the evaluation method of metal contamination according to the present invention.

Results of the lifetime measurements of the Examples 1 to 3 are shown in FIGS. 3, 4, and 5, respectively. FIGS. 3, 4, and 5 are distribution maps illustrating the lifetime at wafer surfaces sectioned by coloring.

According to the results of the Example 1, an average value of the lifetime is 1280 μs and local contamination and contamination at the periphery are seen as shown in FIG. 3.

Because the periphery of the back side of the wafer is held with a silicon carbide (SiC) ring in the RTP process, the contamination is considered to be brought about therefrom. That is, it is confirmed that distribution of metal contamination is grasped with high precision when wafers prepared under the condition of Example 1 were used.

According to the results of the Examples 2 and 3, an average lifetime for the respective Examples was 1080 μsec for both cases. As indicated in FIGS. 4 and 5, reduction of lifetime due to vacancy was observed. This reduction of the lifetime due to vacancy is affected largely in the central area of the wafer, though appearing in the whole area. The reason of this phenomenon is attributed to a fact that a pulling rate of 1.5 mm/min is too fast in the Examples 2 and 3.

Experiment 2

In the experiment 2, the relationship between measured lifetime against resistivity and surface recombination speed are verified for different passivation methods: an RTO film and corona charging (Example 4), a thermal oxide film (Comparative Example 1), and an HF passivation film (Comparative Example 2).

Figure 6:
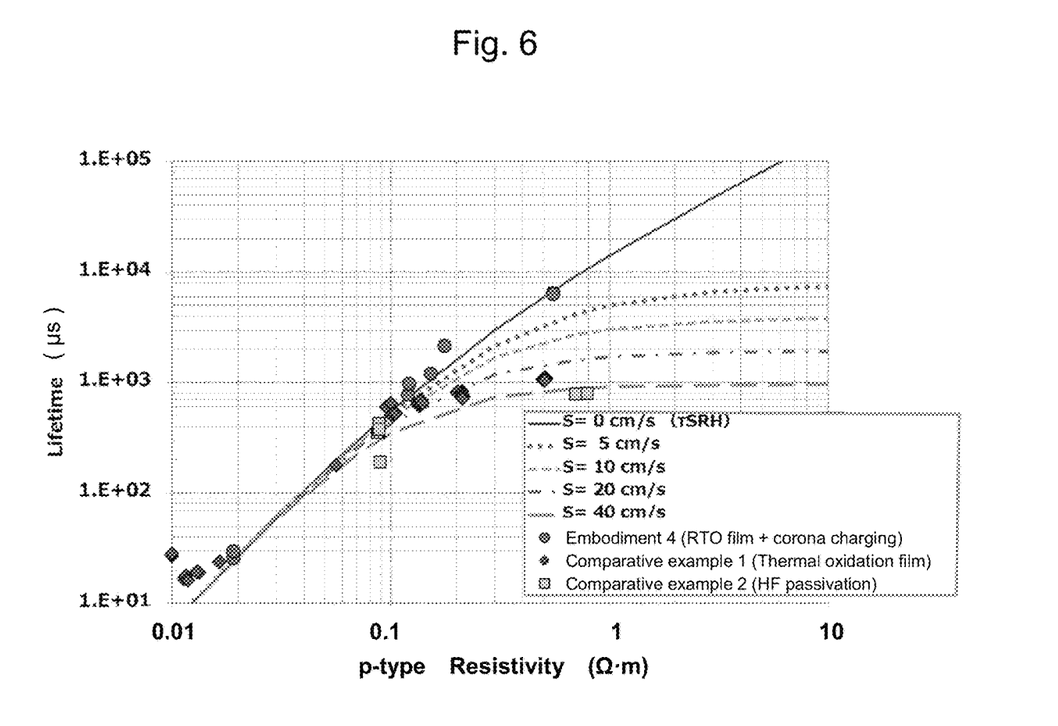
FIG. 6 is a graph of the result of Example 4 and Comparative Examples 1 and 2 of the evaluation method of metal contamination according to the present invention.

Graphs in FIG. 6 show the results of the Example 4, the Comparative Example 1 and the Comparative Example 2. The vertical axis is lifetime and the horizontal axis is resistivity of p-type wafers. In addition, curves corresponding to the surface recombination speed S of 5 cm/s, 10 cm/s, 20 cm/s and 40 cm/s are shown.

The surface recombination speed are found to be S=20 cm/s for thermal oxidation and S=20 to 40 cm/s for HF passivation. In contrast, in the Example 4, a long lifetime value which is close to the true bulk value of the surface recombination speed S=0 cm/s was obtained.

Experiment 3

In the experiment 3, a relation between lifetime values and Fe—B concentration was verified. In Example 5, using p-type wafers grown at a pulling rate of 0.6 mm/min having an oxygen concentration of $0.8 \times 10^{18}$ atoms/cm³ and a dopant concentration of $7.8 \times 10^{14}$ atoms/cm³, an RTO film was formed according to the embodiment of the present invention, lifetime measurement was performed after corona-charging passivation, then Fe—B concentration was obtained by the SPV method. As a Comparative Example 3, using p-type wafers prepared under the same condition, the lifetime with an HF passivation was measured and the Fe—B concentration was obtained.

Figure 7:
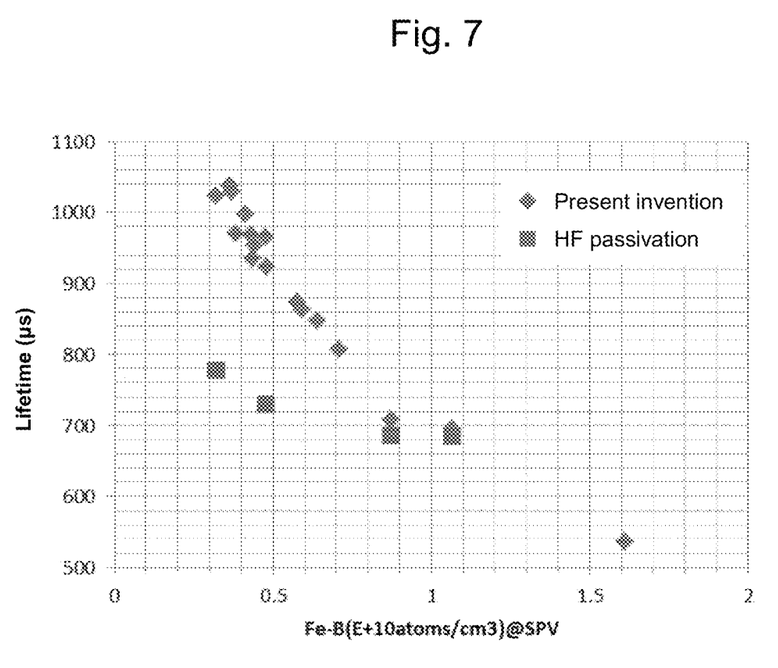
FIG. 7 is a graph of the result of Example 5 and Comparative Examples 3 of the evaluation method of metal contamination according to the present invention.

The graph in FIG. 7 shows the results of the Example 5 and the Comparative Example 3. The vertical axis and the horizontal axis in FIG. 7 are lifetime value and Fe—B concentration, respectively.

As shown in FIG. 7, a strong correlation was observed between the lifetime and the Fe—B concentration in the embodiment 5. In the Comparative Example 3, however, a weak correlation was observed because long lifetime values were not obtained.

Experiment 4

In the experiment 4, with a different condition of wafers to be used from the experiment 3, a correlation between the lifetime values and the Fe—B concentration was verified.

In Example 6, using p-type wafers grown at a pulling rate of 1.5 mm/min having an oxygen concentration of $0.8 \times 10^{18}$ atoms/cm$^3$ and dopant (boron) concentration of $3.7 \times 10^{14}$ atoms/cm$^3$, a RTO film was formed according to the embodiment of the present invention, a lifetime measurement was performed after corona-charge passivation, and then Fe—B concentration was obtained by the SPV method.

Figure 8:
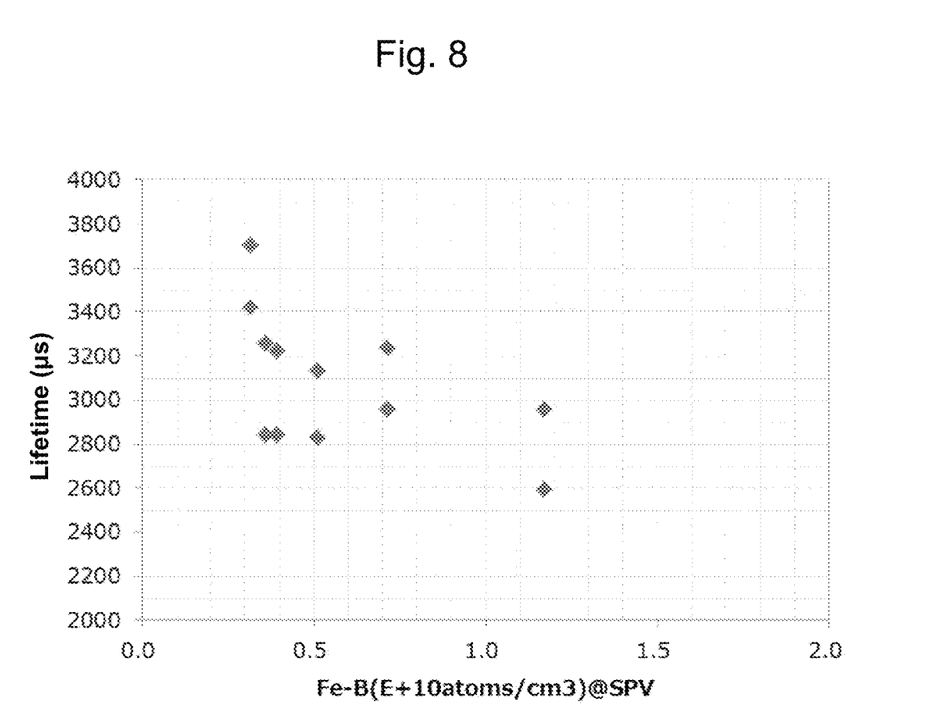
FIG. 8 is a graph of the result of Example 6 of the evaluation method of metal contamination according to the present invention.

Results of the Example 6 is shown in FIG. 8. The vertical axis and the horizontal axis in FIG. 8 are lifetime value and Fe—B concentration, respectively.

As shown in FIG. 8, no correlation was observed between the lifetime and the Fe—B concentration in the Example 6. Lifetime reduction due to oxygen and vacancy was observed; the pulling rate of the single crystal, 1.5 mm/min was considered too fast.

Experiment 5

In the experiment 5, difference of an amount of transferred metal contamination to a wafer due to different heat processing temperature was verified by the lifetime measurement according to the present invention. In this experiment, n-type wafers were used, which were grown at a pulling rate of 0.5 mm/min having an oxygen concentration of $1.2 \times 10^{18}$ atoms/cm$^3$ and a dopant (phosphorus) concentration of $1.0 \times 10^{14}$ atom/cm$^3$. RTO films were formed at temperatures and for heat processing times: 1100° C. for 30 s in the Example 7, 1150° C. for 30 s in the embodiment 8, 1200° C. for 30 s in the Example 9, 1250° C. for 30 s in the Example 10, and 1275° C. for 30 s in the Example 11. Then after corona charging passivation, the lifetime was measured by a µ-PCD apparatus.

Figure 9:
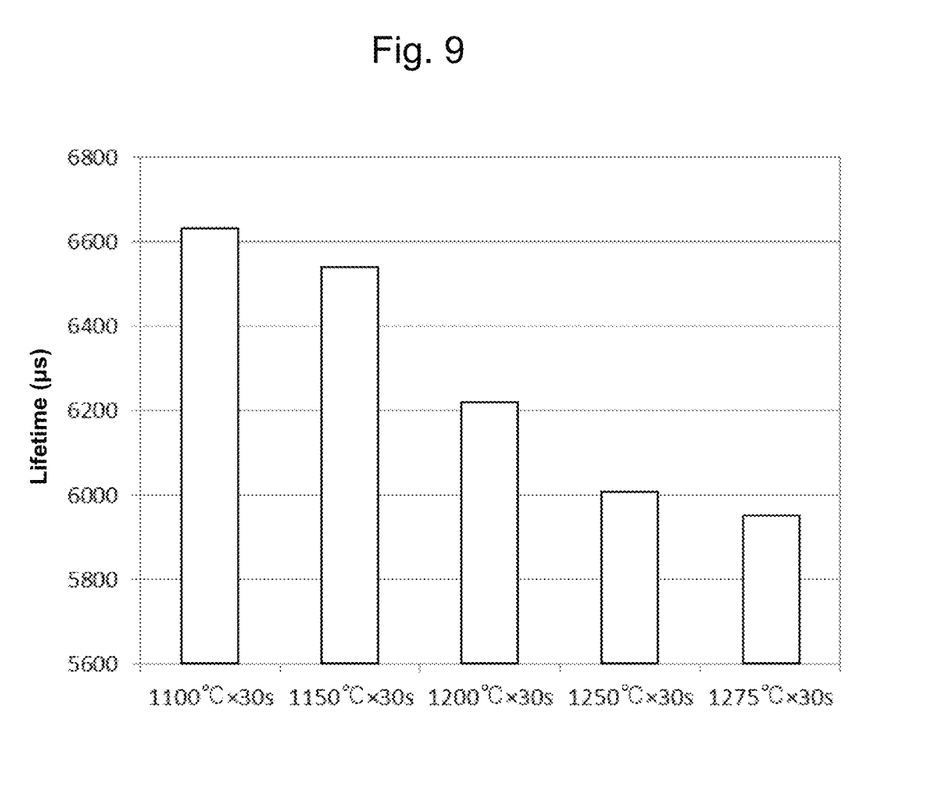
FIG. 9 is a graph showing the result of Examples 7 to 11 of the evaluation method of metal contamination according to the present invention.

The results of Examples 7 to 11 are shown in a bar graph of FIG. 9. As clearly seen from the graph, it is confirmed that the lifetime measurement enables to detect the difference of an amount of transferred metal contamination to a wafer at different heat processing temperatures.

Based on the results of Examples 7 to 11, a correlation between lifetime values and Fe—B concentration was obtained using the following expressions (1) through (3).

Expression 1:

$$\frac{1}{\tau} = \frac{1}{\tau_b} + \frac{1}{\tau_s}. \tag{1}$$

-continued $$\tau_{SRH} = \frac{\tau_n(p_0 + p_1 + \Delta p) + \tau_p(n_0 + n_1 + \Delta n)}{p_0 + n_0 + \Delta n}, \tag{2}$$

$$n_1 = n_i e^{(E_t - E_i)/kT}, \; p_1 = n_i e^{-(E_t - E_i)/kT},$$

$$\tau_p = (\sigma_p v_{th} N_t)^{-1}, \; \tau_n = (\sigma_n v_{th} N_t)^{-1}.$$

$$\tau_S = \tau_{dif} + \tau_{sr}, \; \tau_{dif} = \frac{t^2}{\pi^2 D}, \; \tau_{sr} = \frac{t}{2S}. \tag{3}$$

In Expression (1), assuming that i denotes a calculated lifetime, $T_b$ is a bulk lifetime and r, is a surface recombination lifetime.

The Shockley-Read-Hall expression is used as the Expression (2) that determines a bulk lifetime $T_b$. In the above expressions, $n_0$ and $p_0$ are respectively carrier density of electrons and holes at an equilibrium state, Δn and Δp are respective injected carrier density, $v_{th}$ is a thermal velocity of the carriers, $n_i$ is the intrinsic carrier density, $E_i$ is the intrinsic energy level, $\sigma_n$ and $\sigma_P$ are respectively capture cross-sections of impurities for electrons and holes, $N_t$ is impurity carrier density, $E_t$ is an energy level of impurity, k is the Boltzmann constant, and T is the temperature.

It is assumed that the impurity is iron (Fe), the impurity energy level $E_t$ is 0.4 eV, the capture cross-section $\sigma_n$ is $3.6 \times 10^{-15}$ cm$^2$, the dopant, phosphorous P, concentration $n_0$ in the wafers is $1 \times 10^{14}$ atoms/cm$^3$, and the temperature T is 300 K. Since the carrier density at thermal equilibrium is given by the following equation: $p_0 \cdot n_0 = n_i^2$, $p_0$ is determined. When lifetime measurement is performed with a µ-PCD apparatus at the standard mode, because laser light of a wavelength of 904 nm is used to inject carriers of $5 \times 10^{13}$/cm$^2$, the injected carrier densities Δn and Δp are obtained by dividing the number of the injected carriers by the wafer thickness of t=775 µm.

S denotes a surface recombination speed. In the expression (3) for obtaining the surface recombination lifetime r, is expressed by the diffusion term $\tau_{dif}$ from the front face to the rear face and the recombination term $\tau_{sr}$ at the front and rear face of the surface recombination lifetime. D denotes the diffusion coefficient of minority carriers, t denotes a thickness of the wafer, and the surface recombination speed is assumed to be 6 cm/s.

Figure 10:
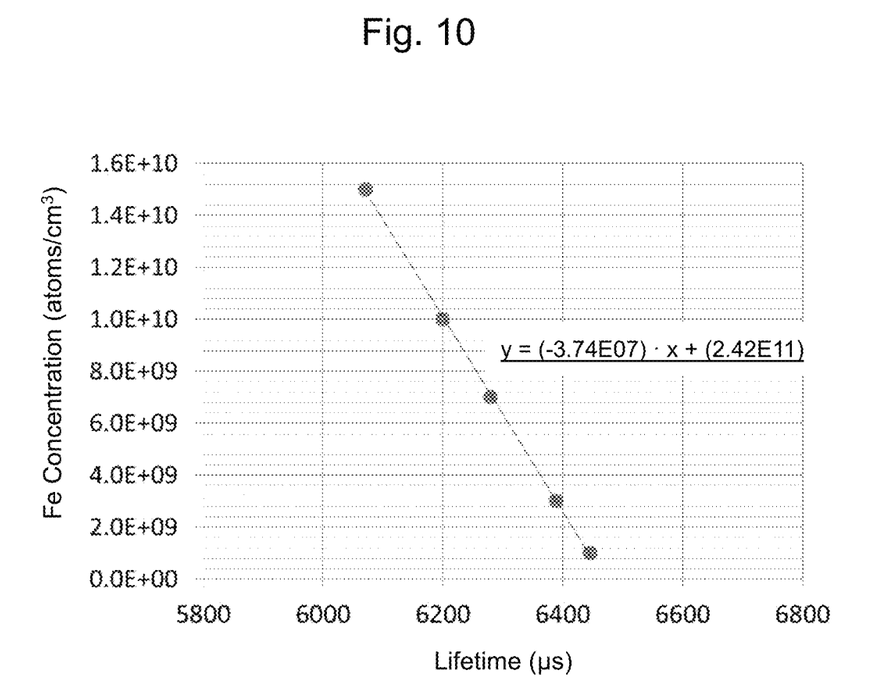
FIG. 10 is a graph showing a relation between the lifetime and the Fe concentration that is obtained using a mathematical operation expression.

Results, calculated values, using the equations are shown on a graph in FIG. 10. In FIG. 10, the vertical axis, y axis, is concentration of Fe (atoms/cm$^3$) and the horizontal axis, x axis, is lifetime (µs).

From the graph, a relational expression (4) between the concentration of Fe, a metal impurity, (y axis) and the lifetime (x axis) is obtained.

Expression 2:

$$y = (-3.74E07) \cdot x + (2.42E11) \tag{4}$$

It is confirmed that Fe contamination concentration is accurately obtainable by obtaining measured values of lifetimes using the evaluation method of metal contamination according to the present invention.

Experiment 6

In the experiment 6, growing conditions of single crystals from which silicon wafers for the evaluation method of metal contamination according to the present invention are sliced were further verified. Specifically, a preferable range of pulling rate of crystals and a preferable range of oxygen concentration were verified. In this experiment, conditions of pulling rate of crystals and oxygen concentration for Examples 12 to 26 are set as shown in Table 1, and lifetime measurements were carried out using a μ-PCD apparatus after RTO film formation and corona-charging passivation.

Conditions for Examples 12 to 26 are that p-type silicon wafers having a resistivity of 0.36 Ω·m and a boron dopant concentration of $3.7 \times 10^{14}$ atoms/cm$^3$ were used, the part of the crystal from which wafers were sliced was the central part of the single crystal with a length of 1000 mm or more, the condition of the RTP apparatus was 1350° C. for 30 s, and the cooling rate to 600° C. was 120° C./s.

Let the theoretical lifetime ($\tau_{SRH}$) estimated from the dopant concentration be 3800 μs, evaluation was done as follows: in case of an average lifetime over the wafer surface (in-plane averaged lifetime) being less than 50% of TSRH, that is, 1900 μs, the Example is "Failed", "Failed" shown in Table 1, and in case of the in-plane averaged lifetime is 50% or more, the Example is "Passed", "Passed" shown in Table 1.

TABLE 1

| | Pulling rate (mm/min) | Oxygen Concentration ($\times 10^{18}$ atoms/cm$^3$) | In-Plane Averaged Lifetime (μs) | Judgement |
|---|---|---|---|---|
| Example 12 | 0.6 | 0.8 | 3910 | Passed |
| Example 13 | 0.6 | 1.2 | 3640 | Passed |
| Example 14 | 0.6 | 1.4 | 1720 | Failed |
| Example 15 | 0.9 | 1.2 | 3440 | Passed |
| Example 16 | 0.9 | 1.3 | 2910 | Passed |
| Example 17 | 0.9 | 1.5 | 1590 | Failed |
| Example 18 | 1.0 | 1.1 | 2950 | Passed |
| Example 19 | 1.0 | 1.3 | 2570 | Passed |
| Example 20 | 1.0 | 1.4 | 1810 | Failed |
| Example 21 | 1.1 | 1.0 | 1800 | Failed |
| Example 22 | 1.1 | 1.2 | 1660 | Failed |
| Example 23 | 1.1 | 1.3 | 1500 | Failed |
| Example 24 | 1.4 | 0.9 | 1450 | Failed |
| Example 25 | 1.4 | 1.1 | 1350 | Failed |
| Example 26 | 1.4 | 1.4 | 1220 | Failed |

As shown in Table 1, good results are obtained when the pulling rate is 1.0 mm/min or lower and the oxygen concentration is $1.3 \times 10^{18}$ atoms/cm$^3$ or lower.

Experiment 7

In the experiment 7, in order to determine the appropriate position at which wafers are sliced, positional conditions were set for Examples 27 to 35 and in-plane average lifetimes were verified similarly to experiment 6. Conditions of Examples 27 to 35 and the results were shown in Table 2. In this experiment the pulling rate was 0.6 mm/min and the oxygen concentration was $1.2 \times 10^{18}$ atoms/cm$^3$, other conditions are the same as in the experiment 6.

TABLE 2

| | Crystal Position | In-surface Averaged Lifetime (μs) | Judgement |
|---|---|---|---|
| Example 27 | 20 mm from the head | 890 | Failed |
| Example 28 | 30 mm from the head | 1600 | Failed |
| Example 29 | 40 mm from the head | 2240 | Passed |
| Example 30 | 50 mm from the head | 3550 | Passed |
| Example 31 | at the center of the ingot | 3640 | Passed |
| Example 32 | 50 mm from the tail | 3700 | Passed |
| Example 33 | 40 mm from the tail | 3010 | Passed |
| Example 34 | 30 mm from the tail | 1860 | Failed |
| Example 35 | 20 mm from the tail | 1120 | Failed |

Good results were obtained for wafers sliced from the region except regions of 40 mm from the head and 40 mm from the tail of the ingot.

From the results of the Examples above, it is confirmed that an amount of metal contamination is accurately evaluated by measuring the lifetime due to metal contamination with suppressing lifetime reduction due to vacancy, in case that the pulling rate of silicon single crystals is 1.0 mm/min or less, oxygen concentration is $1.3 \times 10^{18}$ atoms/cm$^3$ or less, and the region from which wafers are sliced is except regions of 40 mm from the head of the single crystal ingot and 40 mm from the tail.

REFERENCE SIGNS LIST 10 a single crystal ingot

The invention claimed is:

1. A method of evaluating metal contamination by measuring an amount of metal contaminants transferred to a silicon wafer in a rapid thermal processing apparatus, comprising steps of:
    obtaining a silicon single crystal grown by the Czochralski method at a pulling rate of 1.0 mm/min or lower, the crystal having an oxygen concentration of $1.3 \times 10^{18}$ atoms/cm$^3$ or less;
    slicing silicon wafers from the silicon single crystal except a region of 40 mm toward a central portion from a head of the single crystal and a region of 40 mm toward the central portion from a tail;
    thermally transferring contaminants from members of a furnace to the silicon wafer by holding the silicon wafer at a temperature of not less than 1100° C. and not more than the melting point of silicon for 1 s to 60 s in an oxidizing gas atmosphere and then cooling down at a rate of 5° C./s to 150° C./s to form an oxide film having a thickness of 2 nm or more on the silicon wafer; and
    measuring a lifetime of the silicon wafer to which contaminants are transferred.

2. The method of evaluating metal contamination according to claim 1, wherein in the step of measuring a lifetime of the wafer to which contaminants are transferred, lifetime measurement of the wafer is performed after using corona charging as passivation to the silicon wafer.

3. The method of evaluating metal contamination according to claim 1, wherein lifetime measurement is performed using a μ-PCD apparatus in the step of measuring a lifetime of the silicon wafer to which contaminants are transferred.

4. The method of evaluating metal contamination according to claim 1, to wherein dopant concentration is set to $5 \times 10^{14}$ atoms/cm$^3$ or less, in the step of obtaining a silicon single crystal grown by the Czochralski method at a pulling rate of 1.0 mm/min or lower, the crystal having an oxygen concentration of $1.3 \times 10^{18}$ atoms/cm$^3$ or less.

5. The method of evaluating metal contamination according to claim 1, further comprising a step of obtaining concentration y of a metal impurity that is given by substituting measured lifetime values for x of the following expression, $$y = (-3.74E+07) \cdot x + (2.42E11) \qquad \text{Expression 2:}$$

after the step of measuring the lifetime of the silicon wafer to which contaminants are transferred.

* * * * *